(12) United States Patent
Kost et al.

(10) Patent No.: US 7,706,545 B2
(45) Date of Patent: Apr. 27, 2010

(54) SYSTEMS AND METHODS FOR PROTECTION OF AUDIO AMPLIFIER CIRCUITS

(75) Inventors: Michael A. Kost, Cedar Park, TX (US); Jack B. Andersen, Cedar Park, TX (US); Wilson E. Taylor, Austin, TX (US)

(73) Assignee: D2Audio Corporation, Milpitas, CA (US)

( * ) Notice: Subject to any disclaimer, the term of this patent is extended or adjusted under 35 U.S.C. 154(b) by 1185 days.

(21) Appl. No.: 10/805,594

(22) Filed: Mar. 19, 2004

(65) Prior Publication Data

US 2004/0184627 A1    Sep. 23, 2004

Related U.S. Application Data

(60) Provisional application No. 60/469,776, filed on May 12, 2003, provisional application No. 60/456,414, filed on Mar. 21, 2003, provisional application No. 60/456,430, filed on Mar. 21, 2003, provisional application No. 60/456,429, filed on Mar. 21, 2003, provisional application No. 60/456,421, filed on Mar. 21, 2003, provisional application No. 60/456,422, filed on Mar. 21, 2003, provisional application No. 60/456,428, filed on Mar. 21, 2003, provisional application No. 60/456,420, filed on Mar. 21, 2003, provisional application No. 60/456,427, filed on Mar. 21, 2003.

(51) Int. Cl.
*H03G 11/00* (2006.01)
*H03G 7/00* (2006.01)
*H04B 15/00* (2006.01)
*H02B 1/00* (2006.01)

(52) U.S. Cl. .................. 381/55; 381/56; 381/94.8; 381/106; 381/123

(58) Field of Classification Search .................. 381/55, 381/56, 58–59, 83, 94.8, 106, 123, 120; 330/10, 330/251, 270 A
See application file for complete search history.

(56) References Cited

U.S. PATENT DOCUMENTS 6,396,250 B1 * 5/2002 Bridge ................... 323/283

(Continued)

FOREIGN PATENT DOCUMENTS

EP    1244208 A1    9/2002

(Continued)

OTHER PUBLICATIONS

Notice of Rejection for JP 2006-507403 (issued Nov. 12, 2008).

*Primary Examiner*—Vivian Chin
*Assistant Examiner*—Douglas J Suthers
(74) *Attorney, Agent, or Firm*—Fliesler Meyer LLP

(57) ABSTRACT

Systems and methods for providing protection from failure events in a digital audio amplification system. One embodiment of the invention comprises a system having a digital amplifier controller, an amplifier output stage coupled to the controller and configured to receive audio signals from the controller, one or more sensors coupled to the output stage and one or more low-pass filters coupled to receive sensor signals from the one or more sensors. The low-pass filter is configured to filter the sensor signals and to provide the filtered sensor signals to the controller, which provides a programmable response to the filtered sensor signals. The response may range from not taking any action, to limiting the amplification of audio signals, to shutting down the system.

21 Claims, 5 Drawing Sheets

U.S. PATENT DOCUMENTS

| | | | |
|---|---|---|---|
| 6,498,531 B1 * | 12/2002 | Ulrick et al. | 330/10 |
| 6,529,073 B1 | 3/2003 | Highfill, III et al. | |
| 6,683,494 B2 * | 1/2004 | Stanley | 330/10 |
| 2001/0010482 A1 * | 8/2001 | Oki et al. | 330/10 |
| 2001/0052814 A1 | 12/2001 | Takita | |

FOREIGN PATENT DOCUMENTS

| | | |
|---|---|---|
| JP | 2002-158543 | 5/2002 |
| JP | 2002-171140 | 6/2002 |
| JP | 2003-037452 | 2/2003 |
| JP | 2003-510878 | 3/2003 |
| WO | WO-01/03299 A1 | 1/2001 |

\* cited by examiner

SYSTEMS AND METHODS FOR PROTECTION OF AUDIO AMPLIFIER CIRCUITS

RELATED APPLICATIONS

This application claims priority to U.S. Provisional Patent Application No. 60/469,776, entitled "Marco PWM Protection Logic," by Kost, et al., filed May 12, 2003; U.S. Provisional Patent Application No. 60/456,414, entitled "Adaptive Anti-Clipping Protection," by Taylor, et al., filed Mar. 21, 2003; U.S. Provisional Patent Application No. 60/456,430, entitled "Frequency Response Correction," by Taylor, et al., filed Mar. 21, 2003; U.S. Provisional Patent Application No. 60/456,429, entitled "High-Efficiency, High-Performance Sample Rate Converter," by Andersen, et al., filed Mar. 21, 2003; U.S. Provisional Patent Application No. 60/456,421, entitled "Output Device Switch Timing Correction," by Taylor, et al., filed Mar. 21, 2003; U.S. Provisional Patent Application No. 60/456,422, entitled "Output Filter, Phase/Timing Correction," by Taylor, et al., filed March 21, 2003; U.S. Provisional Patent Application No. 60/456,428, entitled "Output Filter Speaker/Load Compensation," by Taylor, et al., filed Mar. 21, 2003; U.S. Provisional Patent Application No. 60/456,420, entitled "Output Stage Channel Timing Calibration," by Taylor, et al., filed Mar. 21, 2003; U.S. Provisional Patent Application No. 60/456,427, entitled "Intelligent Over-Current, Over-Load Protection," by Hand, et al., filed Mar. 21, 2003; each of which is fully incorporated by reference as if set forth herein in its entirety.

BACKGROUND

1. Field of the Invention

The invention relates generally to audio amplification systems, and more particularly to systems and methods for detecting a variety of potential failure conditions in a digital amplification system and providing a programmable response to the detected failure conditions.

2. Related Art

Pulse Width Modulation (PWM) or Class D signal amplification technology has existed for a number of years. PWM technology has become more popular with the proliferation of Switched Mode Power Supplies (SMPS). Since this technology emerged, there has been an increased interest in applying PWM techniques in signal amplification applications as a result of the significant efficiency improvement that can be realized through the use of Class D power output topology instead of the legacy (linear Class AB) power output topology.

Early attempts to develop signal amplification applications utilized the same approach to amplification that was being used in the early SMPS. More particularly, these attempts utilized analog modulation schemes that resulted in very low performance applications. These applications were very complex and costly to implement. Consequently, these solutions were not widely accepted. Prior art analog implementations of Class D technology have therefore been unable to displace legacy Class AB amplifiers in mainstream amplifier applications.

Recently, digital PWM modulation schemes have surfaced. These schemes use Sigma-Delta modulation techniques to generate the PWM signals used in the newer digital Class D implementations. These digital PWM schemes, however, did little to offset the major barriers to integration of PWM modulators into the total amplifier solution. Class D technology has therefore continued to be unable to displace legacy Class AB amplifiers in mainstream applications.

One of the problems is that prior art means for protecting the PWM amplifier circuitry are not very efficient or effective. Because PWM amplifiers handle high currents and voltages, there is a danger that the amplifiers may fail in a catastrophic manner. For example, the amplifiers may be driven until they overheat and burn up their circuitry.

Existing protection schemes make use of traditional analog-based circuits. These circuits have a number of shortcomings. For instance, prior art protection circuits conventionally have to be characterized and adjusted in a laboratory environment. Once the design of a protection circuit is finalized, it is not possible to adjust the circuit in a particular amplifier. As a result of manufacturing tolerances, the actual operation of the circuit can vary significantly from one amplifier to another. The RC circuits that provide the time constant mechanisms in the design are particularly vulnerable to manufacturing tolerances. The circuit may therefore operate as intended in one device, while initiating a response to a failure condition either too quickly or too slowly in another device.

Another of the shortcomings of conventional protection circuits is that the response to a particular failure condition is fixed. Typically, the response will simply be to shut down the amplifier upon detecting the failure condition. While this response may be appropriate for a condition such as excessive current in the amplifier (which could destroy the amplifier's circuitry), it may not be appropriate for a condition such as a temperature that is slightly elevated, but that would not cause immediate damage to the system.

Still another of the shortcomings of conventional protection schemes is that they typically require a separate circuit to handle each of the potential failure conditions. The need for separate circuitry increases the complexity of the overall system design and consequently increases the likelihood of related problems, such as component failures, power consumption, heat build up, and the like.

It would be desirable to provide a protection schemes for a digital PWM amplification system that did not suffer from these shortcomings.

SUMMARY OF THE INVENTION

One or more of the problems outlined above may be solved by the various embodiments of the invention. Broadly speaking, the invention comprises systems and methods for providing protection from failure events in a digital audio amplification system.

One embodiment of the invention comprises a system having a digital amplifier controller, an amplifier output stage coupled to the controller and configured to receive audio signals from the controller, one or more sensors coupled to the output stage and one or more low-pass filters coupled to receive sensor signals from the one or more sensors. The low-pass filter is configured to filter the sensor signals and to provide the filtered sensor signals to the controller, which provides a programmable response to the filtered sensor signals. The response may range from not taking any action, to limiting the amplification of audio signals, to shutting down the system.

In one embodiment, a system as described above is implemented in a pulse width modulated (PWM) amplification system. This system may detect failure conditions including over-current conditions, over-temperature conditions and shoot-through conditions. The system may be configured to automatically calibrate high-side and low-side signal delays to optimize the dead time between high-side and low-side pulses and minimize shoot-through. The low-pass filters in the system may comprise accumulators that are configured to accumulate bits from binary protection signals. These protection signals may be generated by comparators that compare sensor signal levels to reference levels and then produce high or low signals, depending upon whether the sensor signals are above or below the respective thresholds. The accumulators may be integrated into a processor such as a digital signal processor (DSP) that provides the controller functionality.

Another embodiment of the invention comprises a method including the steps of sensing a condition of an audio amplifier output stage, providing a sensor output signal corresponding to the sensed condition, low-pass filtering the sensor output signal to produce a filtered sensor signal, providing the filtered sensor signal to an audio amplifier controller and providing a programmable response to the filtered sensor signal. The method may be implemented in a system such as is described above.

Numerous additional embodiments are also possible.

The various embodiments of the invention may provide a number of advantages over the prior art. For example, by performing the low-pass filtering of the protection signals in a programmable accumulator, the behavior of the accumulator as a low-pass filter may be easily modified after manufacture. The variability inherent in prior art protection mechanisms can therefore be avoided. Further, because the filtered protection information is provided to a programmable controller, the controller can provide a programmable response to various different failure conditions that may be detected, rather than being limited to a single response (i.e., shutting down the system), as in the prior art. Still further, the implementation of digital protection mechanisms as used in the various embodiments may enable functions such as the automatic calibration of signal delays to minimize shoot-through current and optimize the performance of the amplifier. Still other advantages will be apparent to those of skill in the art of the invention.

BRIEF DESCRIPTION OF THE DRAWINGS

Other objects and advantages of the invention may become apparent upon reading the following detailed description and upon reference to the accompanying drawings.

Figure 1:
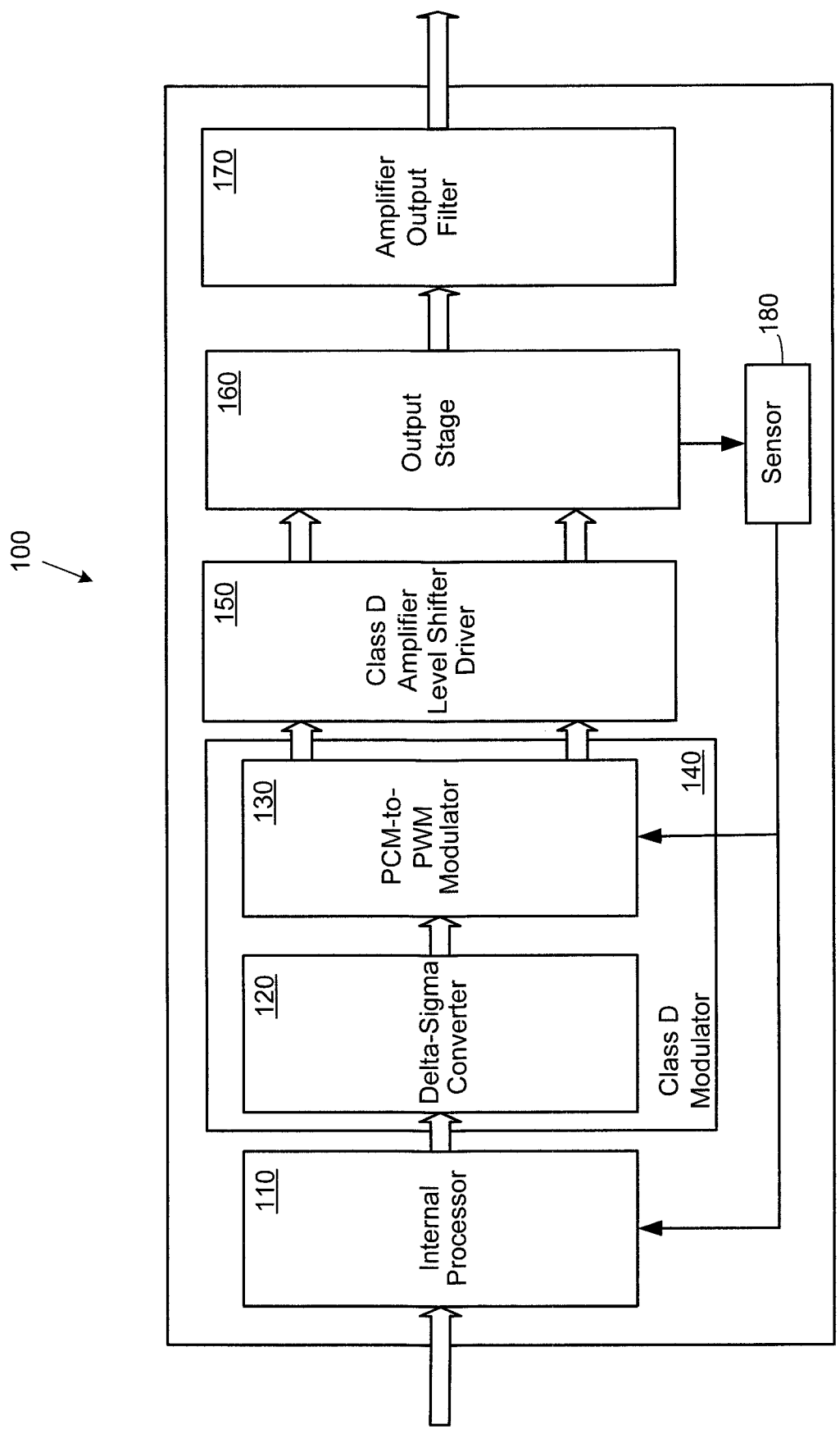
FIG. 1 is a functional block diagram illustrating a PWM amplification system in accordance with one embodiment.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims.

DETAILED DESCRIPTION OF PREFERRED EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for providing protection from failure events in a digital audio amplification system. One embodiment of the invention comprises a protection subsystem for a digital pulse width modulated (PWM) amplification system, wherein signals from failure condition sensors are digitized and low-pass filtered, then processed to determine the appropriate response to the signals. The response to each of the signals and corresponding failure conditions is programmable and may range from no action, to reducing the level of amplification, to shutting down the system.

In one embodiment, the digital PWM amplification system is implemented using a digital signal processor (DSP) to process the failure condition signals as well as the audio signals. Each failure condition signal is passed through a separate low-pass filter before being processed by common protection logic. The low-pass filters are implemented as accumulators that count up or down, based on whether the corresponding digital failure condition signal is 1 or 0. Each of the accumulators has a corresponding threshold, such that when the count of the accumulator exceeds the threshold, a failure event has occurred and a corresponding response is triggered. As indicated above, these responses are programmable.

In one embodiment, the system is configured to protect against over-current conditions, over-temperature conditions, and shoot-through current. Separate sensor components and corresponding comparators are used to sense each of these conditions and generate corresponding output signals. The signals are processed through corresponding accumulators that serve to low-pass filter the signals. The filtered signals are then processed by common logic within the DSP to generate programmable responses to the conditions indicated by the signals.

Referring to FIG. 1, a functional block diagram illustrating a PWM amplification system in accordance with one embodiment of the invention is shown. As depicted in the figure, PWM amplification system 100 comprises an internal processor 110, a delta-sigma converter 120, a PCM-to-PWM modulator 130, a Driver 150, an output stage 160, an output filter 170 and a sensor subsystem 180. Delta-sigma converter 120 and PCM-to-PWM modulator 130 form a Class D modulator 140.

A digital audio signal is first input to internal processor 110. Internal processor 110 performs audio processing on the digital audio signal. The internal processor 110 may perform various types of processing on the signal, including the modification of the signal in response to a detected failure condition of the system. This will be discussed in more detail below. The processed digital audio signal is then converted to a 1-bit digital data stream by Class D modulator 140. This 1-bit data stream is characterized by two control signals that are output to driver 150, which then uses the signals to drive the upper and lower switches of output stage 160. The signal produced by output stage 160 is then processed by output filter 170. The signal output by filter 170 can then be used to drive a speaker system (not shown).

Output stage 160 handles the high voltages and high currents that typically are the sources of system failures. The present protection system therefore incorporates sensor subsystem 180 which is tightly coupled to output stage 160. In one embodiment, sensor subsystem 180 incorporates both temperature and current sensors for each of the audio amplification channels in the system, and can therefore sense potential failure conditions including over-current conditions, over-temperature conditions and shoot-through conditions.

Figure 2:
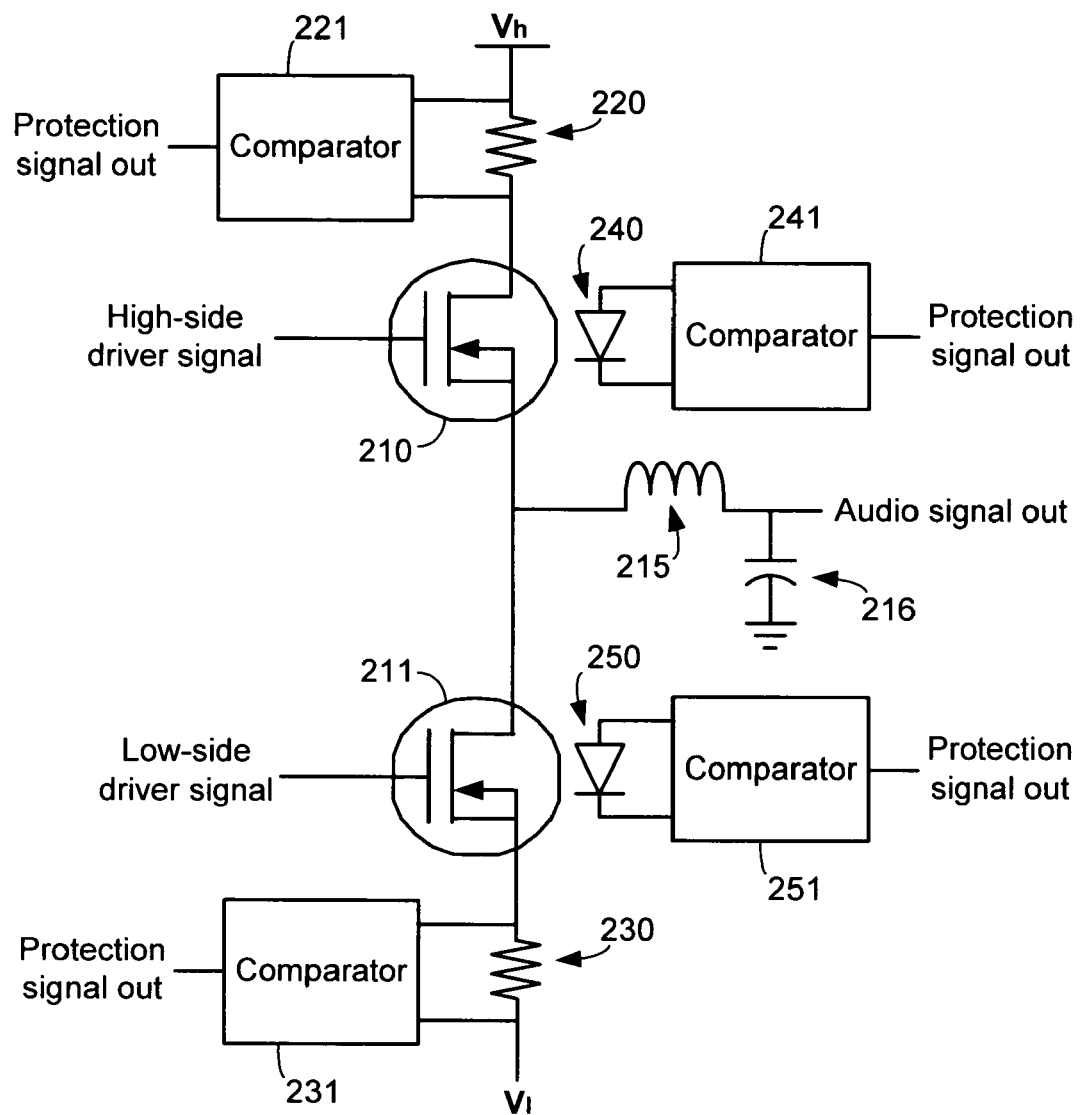
FIG. 2 is a diagram illustrating the interrelation of the output stage and the sensor subsystem in accordance with one embodiment.

Referring to FIG. 2, a diagram illustrating the interrelation of the output stage and the sensor subsystem in accordance with one embodiment is shown. It should be noted that, for the purposes of clarity, the diagram only shows the major components of the output stage and sensor subsystem.

In FIG. 2, the output stage components consist primarily of high-side FET 210, low-side FET 211, inductor 215 and capacitor 216. As described above, the driver circuit provides a high-side signal and a low-side signal to the output stage. The high-side signal drives FET 210, while the low-side signal drives FET 211. The high-side and low-side signals alternately switch FETs 210 and 211 on and off to generate a single signal that is modulated between $V_I$ and $V_h$. This signal is filtered by inductor 215 and capacitor 216 before being provided as an output signal.

The sensor subsystem depicted in FIG. 2 consists of resistors 220 and 230, thermal diodes 240 and 250, and corresponding comparators 221, 231, 241 and 251. Each of the circuit component-comparator pairs (e.g., resistor 220 and comparator 221) produces a protection signal that is related to the corresponding failure condition. "Failure condition" is used here to refer generally to a condition that may lead to a failure and consequently is being monitored. For example, an excessive amount of current through the FETs is a failure condition for the purposes of this disclosure. This protection signals are provided to a protection system that will be described in more detail below. The protection system processes the signals to determine whether the failure conditions warrant a response and provides the appropriate response if necessary.

The operation of each circuit component-comparator pair is relatively straightforward. Considering, for example, resistor 220 and comparator 221, the current that flows through high-side FET 210 also flows through resistor 220. A voltage is therefore developed across resistor 220, wherein the voltage is proportional to the current through FET 210. Comparator 221 compares the voltage across resistor 220 (an analog signal) to a reference value and generates a corresponding binary protection signal. If the voltage across resistor 220 is less than the reference value, the protection signal is low (binary 0). If the voltage across resistor 220 is greater than the reference value, the protection signal is high (binary 1). The operation of comparator 231 in conjunction with resistor 230 is identical, except that they measure the current flow through FET 211 instead of FET 210. It should be noted the current could be measured in other ways, e.g., Hall effect sensors or transformers, in other embodiments.

The operation of the thermal diode-comparator pairs is the same as that of the resistor-comparator pairs except for the functionality of the thermal diodes (as compared to the resistors). Considering thermal diode 240 and comparator 241, thermal diode 240 is placed as close as possible to FET 210 in order to provide the best possible thermal contact between the two. Thermal diode 240 will therefore track the temperature of FET 210. Within a certain temperature range, the voltage across thermal diode 240 varies linearly with changes in temperature. (It is assumed that comparator 241 includes circuitry to apply a potential across thermal diode 240 and various other circuit components in order to be able to measure a voltage across thermal diode 240.) Comparator 241 compares the voltage across thermal diode 240 to a reference value and generates a corresponding protection signal. If the voltage across thermal diode 240 is less than the reference value, the protection signal is low, and if the voltage is greater than the reference value, the protection signal is high. Comparator 251 and thermal diode 250 operate in the same manner, except that they measure the temperature of FET 211 instead of FET 210.

It should be noted the temperature could be measured in other ways in other embodiments. For example, temperature sensitive resistors or temperature sensing integrated circuits could be used. Also, other embodiments could sense the temperature indirectly. For instance, the transistors of the output stage are typically coupled to a heat sink in order to dissipate their heat, so the sensors could be coupled to the output stage's heat sink, rather than being directly coupled to the transistors. Still other variations are also possible.

As noted above, one embodiment of the invention is configured to detect shoot-through current. Normally, only one of FETs 210 and 211 is turned on at any time, so current flows through one or the other, but not both. Shoot-through is the condition in which both FETs are turned on at the same time, allowing current to flow through both FETs. Typically, this current is much greater than the current that flows through a single one of the FETs. Shoot-through is not desirable for a number of reasons, including the fact that it dramatically increases the power consumption of the amplifier.

Shoot-through can be detected using the same resistor-comparator pairs that are used to detect over-current conditions. In one embodiment, current spikes corresponding to shoot-through are detected using a single resistor-comparator pair. In an alternative embodiment, both high-side and low-side resistor-comparator pairs can be used to detect shoot-through. In one embodiment, information on the currents through the FETs is used to adjust to the timing of the high-side and low-side signals to eliminate excessive shoot-through current.

Figure 3:
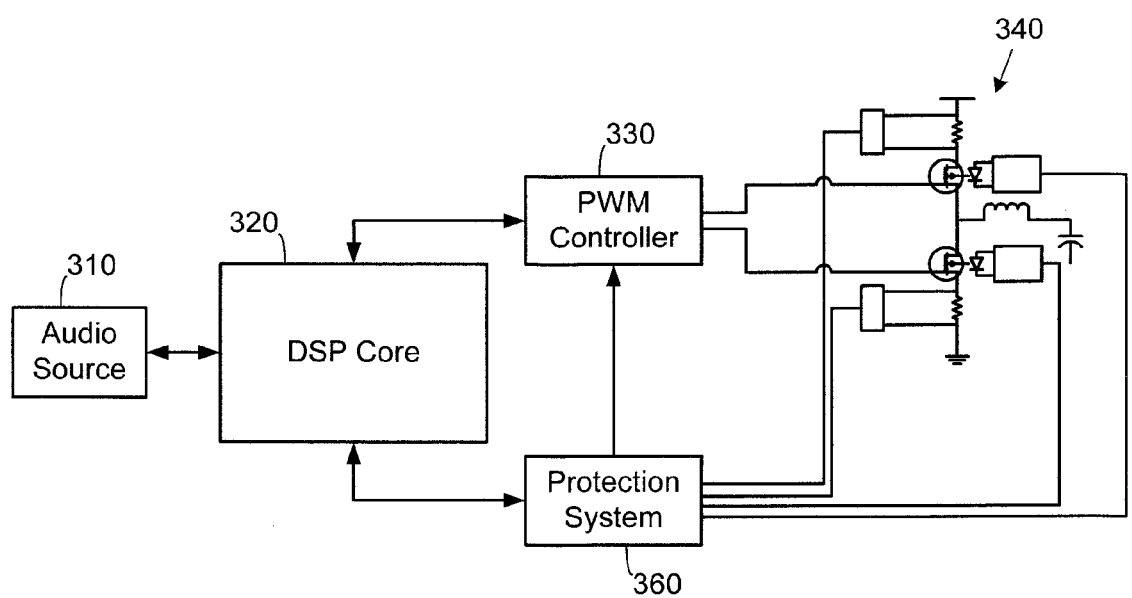
FIG. 3 is a functional block diagram illustrating the interconnection of an output stage and a sensor subsystem to other system components in accordance with one embodiment.

Referring to FIG. 3, a functional block diagram illustrating the interconnection of the output stage and sensor subsystem to other system components in accordance with one embodiment is shown. In this embodiment, audio data from an audio source 310 is input to the DSP core 320 of the PWM amplifier. The audio data is processed by DSP core 320 and provided to PWM controller 330. PWM controller 330 outputs high-side and low-side signals to drive the FETs of output stage 340. Typically, the FETs are driven using a driver component, rather than directly by PWM controller 330, but the driver is not shown in FIG. 3 for purposes of clarity.

The sensor subsystem (including the resistors, thermal diodes and comparators described in connection with FIG. 2) is coupled to the output stage to provide feedback on its operation. The output of each of the comparators is transmitted to protection system 360. Protection system 360 processes these inputs and determines whether the signals indicate that a failure has occurred or is about to occur. Protection system 360 then generates an appropriate response and transmits this response to DSP core 320 and/or PWM controller 330, which can then shut down the system or adjust its operation to avoid a failure event.

Figure 4:
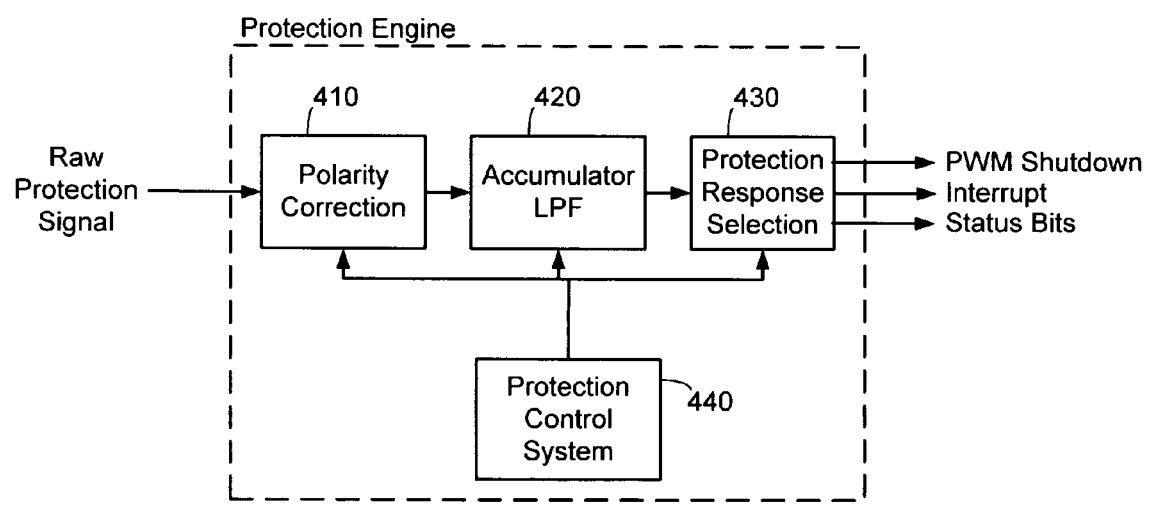
FIG. 4 is a functional block diagram illustrating the components of a protection system in accordance with one embodiment.

Referring to FIG. 4, a functional block diagram illustrating the components of protection system 360 in accordance with one embodiment is shown. It should be noted that the components illustrated here correspond to a single protection channel. In other words, a signal is taken from a single one of the comparators described above and is processed to determine whether that signal indicates that a failure is impending. Protection system 360 may be configured to handle multiple protection channels. Responses corresponding to detected failure conditions on any of these channels can then be generated by the protection system.

As depicted in FIG. 4, a raw protection signal is received from one of the comparators and is input to a polarity correction unit 410. Polarity correction unit 410 may be used to convert the raw protection signal from high to low, or from low to high, as it may be desirable to implement some protection signals as active high, while others are active low. The polarity corrected signal is then provided to accumulator 420. Accumulator 420 acts as a low pass filter. The filtering characteristics of accumulator 420 are determined by, e.g., the sample rate of the accumulator and the threshold level of the accumulator at which a response is triggered. This will be described in more detail below. The output of accumulator 420 is provided to protection response selection unit 430. Protection response selection unit 430 selects a response which is appropriate to the signal received from accumulator 420. The response may range from taking little or no action to taking very drastic action. For example, protection response selection unit may simply provide status information, or it may provide an interrupt to the DSP core, or it may shut down the PWM amplifier altogether. The components of the protection system are controlled by a protection control subsystem 440.

In one embodiment, the PWM protection subsystem contains a 10-bit accumulator (an accumulation counter) for each of the protection channels. The accumulation counter functions as a low-pass filter and generates a signal indicative of a potential failure event when a programmable accumulation threshold is reached. An 8-bit divider is provided in this embodiment to effectively reduce the sampling rate of the input to the accumulation counter. Each accumulation counter generates an output which is provided to the PWM controller so that appropriate action can be taken in response to the received signals. The output may be provided as polled register bits, interrupts or other types of signals.

As noted above, the accumulation counter functions as a low-pass filter for the raw protection signal received from the comparator of the sensor subsystem. In one embodiment, the accumulation counter has a threshold value of X and a maximum value of 2X. When the protection signal input to the accumulation counter is 0, the counter is decremented. When the protection signal is 1, the counter is incremented. The sample period for the accumulation counter is controlled through the use of the divider mentioned above. If the value of the counter is less than X, the output of the accumulation counter is not asserted (e.g., it is low). When the value of the counter equals or exceeds X, the output of the speculation counter is asserted (e.g., it is high), indicating that a condition associated with a potential failure has been detected.

The value of X is equivalent to a time constant for the accumulator. For example, if the value of X is large, it will take a long time for the accumulator to trigger a response to its input. On the other hand, if the value of X is small, it will take a short time for the accumulator to trigger a response. In one embodiment, X is a programmable value, so the accumulator can be programmed to respond to its input very quickly, or very slowly. The behavior of the accumulator can also be affected by other factors, such as whether the accumulator saturates at either or both limits. "Saturate," as used here, means that when the accumulator reaches its upper limit, it remains at the limit rather than incrementing/decrementing past the limit or resetting. The accumulator may also have inputs to clear the accumulator or reset it to a known state.

The outputs of the accumulators for the different protection channels are handled by software that executes protection algorithms appropriate to the respective failure conditions. The algorithms employed in one embodiment to handle over-temperature, over-current and shoot-through conditions are described below.

In one embodiment, the system is configured with one over-temperature channel per audio channel. The over-temperature channel comprises a thermal sensor and a corresponding comparator that generates a binary output signal as described above. The accumulator is programmed to accumulate the binary output of the comparator with a time constant of several milliseconds. The system will set a sticky-bit when the accumulator reaches its threshold value (50 percent of its maximum value). The purpose of the sticky-bit is to ensure that an indication of the over-temperature condition is maintained until it can be noted by the algorithm that controls the generation of responses to this condition. After the software detects the sticky-bit, it clears the accumulator and the sticky-bit. The software as exemplified by the routine shown below, runs periodically during background system maintenance.

```
if (errorBitSet( ) == 1)
{    error += C_ERROR_INC;
     attenuate_output( );
     clearErrorBit( );
}
else
     error -= C_ERROR_DEC;
if (error > C_SHUTDOWN)
     shutdown_pwm( );
```

As used in this algorithm, errorBitSet( ) is 1 when the output of the accumulator transitions from 0 to 1 (i.e., reaches the threshold), and may be 1 when the output of the accumulator remains at 1, depending upon an error logic status bit. C_ERROR_INC and C_ERROR_DEC are the error increment and decrement values, respectively. If the number of errors reaches a redetermined number (C_SHUTDOWN), the amplifier is shut down via the shutdown_pwm( ) function. The attenuate_output( ) function engages a compressor/limiter, while the clearErrorBit( ) function clears the accumulator.

Figure 5:
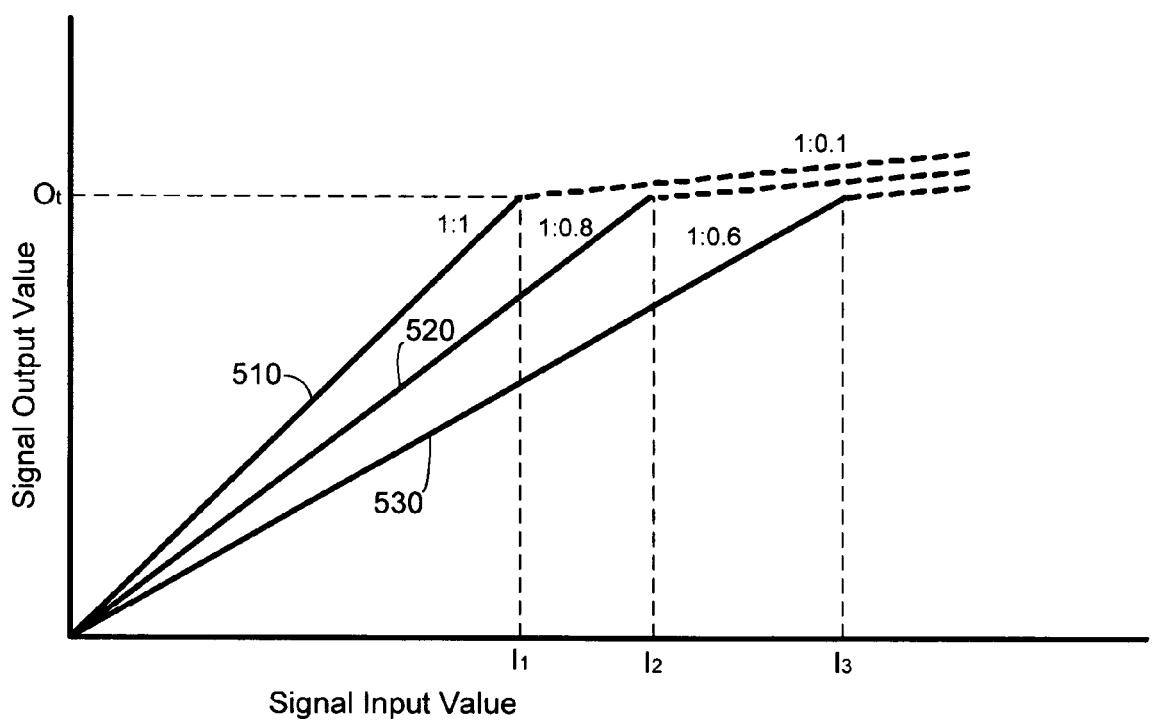
FIG. 5 is a diagram illustrating the compression of audio signals by the the amplifier in accordance with one embodiment.

The compressor/limiter is used to reduce the level of the output signal corresponding to a given input signal level. The compressor/limiter may be implemented in many different ways. In one embodiment, the compressor/limiter does not affect signals that have values below a threshold value, but compresses signals that are above the threshold. This type of compression is illustrated by curves 510, 520 and 530 in FIG. 5. In this figure, the input signal value is on the horizontal axis, while the output signal value is on the vertical axis. The different curves correspond to different levels of amplification in the system. Curve 510 corresponds roughly to a 1:1 amplification for input signals below the threshold of $I_1$. amplification above I1 is reduced to approximately 1:0.1, thereby compressing the portion of the output signal that exceeds output threshold $O_r$. Curve 520 corresponds to a 1:0.8 amplification and curve 530 corresponds to a 1:0.6 amplification for input signals below the threshold of $I_1$. amplification above I1 is reduced to approximately 1:0.1, thereby compressing the portion of the output signal that exceeds output threshold $O_r$.

In one embodiment, the system is configured with one over-current channel per audio channel. The over-current channel includes a resistor and corresponding comparator to generate a binary protection signal which is provided to an accumulator for the channel. The accumulator is programmed to accumulate the input of the comparator with a time constant in the range from 100 ns to 1 us. If the accumulator reaches its threshold value, a sticky-bit is set, and a message is transmitted to the PWM controller. In one embodiment, this message is to reduce the power being applied to the audio output. The accumulator is not cleared by the software. Instead, the system continues to operate at reduced power until the over-current condition is abated for some period of time, as determined by the time constant of the accumulator. In another embodiment, the message to the PWM controller may be to shut off the power to the audio output. This mechanism may be implemented in hardware, software, or a combination thereof. An exemplary software algorithm which may be employed in this instance is shown below.

```
if (errorBitSet( ) == 1)
{
    error += C_ERROR_INC;
    attenuate_output( );
}
else
    error -= C_ERROR_DEC;
if (error > C_SHUTDOWN)
    shutdown_pwm( );
```

The functions used in this algorithm are generally the same as those used in the algorithm described above in relation to over-temperature protection. The primary differences are that the accumulator is not cleared after the failure condition is detected by the software, and the time constants are much smaller for over-current protection.

In one embodiment, the system is configured with one shoot-through channel per audio channel. As described above, one embodiment of a PWM amplification system generates high-side and low-side pulses that turn on high-side and low-side FETs in an output stage. The timing of the high-side and low-side pulses may be adjusted to result in more or less overlap between the pulses. If the pulses overlap, both the high-side and low-side FETs are turned on, and current can rapidly flow through the two FETs. This current is known as "shoot-through" current. On the other hand, if the high-side and low-side pulses are not overlapped, one of the FETs is turned off before the other is turned on. There is therefore a period during which both FETs are off and there is little or no current flowing through the FETs. This period is known as "dead time."

In this embodiment, shoot-through calibration is performed before the audio channel begins normal operation. The calibration is performed to achieve relative timing between the high-side and low-side pulses that neither wastes too much power because of shoot-through current, nor causes too much distortion arising from dead time between the pulses. The calibration is performed by setting the dead time between high-side and low-side pulses to a predetermined maximum value (i.e., setting the pulses to overlap by a predetermined amount) and then gradually reducing the dead time (adjusting the timing between the pulses) until shoot-through occurs at a threshold level. The system then readjusts the relative delays between the high-side and low-side signals to "back off" from the overlap that caused the shoot-through condition. This "backing off" is accomplished by reducing the overlap (i.e., increasing the dead time between high-side and low-side signals) by a predetermined amount. An exemplary algorithm for shoot-through calibration is shown below.

```
setMaxDeadtime( );
repeat
{
    clearAccumulator( );
    runPWM( );
    shortenDeadtime( );
} until (errorBitSet( ) == 1)
expandDeadtime( );
```

As used in this algorithm, the setMaxDeadtime( ) function sets the high-side and low-side signal delays so that the dead time between high-side and low-side pulses is at the predetermined maximum value. The shortenDeadtime( ) function incrementally decreases the dead time, while the expandDeadtime( ) function increases the dead time by a predetermined amount.

Those of skill in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with general purpose processors, digital signal processors (DSPs) or other logic devices, application specific integrated circuits (ASICs), field programmable gate arrays (FPGAs), discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The steps of the methods or algorithms described in connection with the embodiments disclosed herein may be embodied directly in hardware, in software or firmware modules executed by a processor, or in a combination thereof. A software product may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

What is claimed is:

1. A system comprising:
   a digital amplifier controller;
   an amplifier output stage coupled to the controller, and configured to receive audio signals from the controller;
   a plurality of sensors coupled to the output stage;
   a plurality of comparators each configured to compare an output from one of the sensors to a corresponding comparator threshold and produce a binary protection signal indicative of whether the comparator threshold is exceeded; and
   a plurality of accumulators each configured to receive a said binary protection signal from a corresponding one of the comparators, increment a corresponding count when the received binary protection signal is a first state, decrement the corresponding count when the received binary protection signal is a second state, and output a signal indicative of a potential failure condition when the corresponding count exceeds a corresponding accumulator threshold;
   wherein the amplifier output stage includes at least two transistors;
   wherein the controller is configured to perform one of a plurality of different programmable responses in dependence on the signals indicative of potential failure conditions;
   wherein one or more of the plurality of different programmable responses causes the system to operate in a modified manner without causing a turning off of any of the transistors of the amplifier output stage; and
   wherein in dependence on a said signal indicative of a potential failure condition being output by a said accumulator, the system operates in a modified manner for at least a period of time during which the potential failure condition persists until the corresponding count of the accumulator is sufficiently decremented such that the count no longer exceeds the corresponding accumulator threshold.

2. The system of claim 1,
   wherein the one or more sensors comprise at least a current sensor and a temperature sensor;
   wherein one of the comparators and one of the accumulators are associated with the current sensor;
   wherein another one the comparators and another one of the accumulators are associated with the temperature sensor;
   wherein the controller is configured to detect an over-current condition in the output stage in dependence on the output of the accumulator associated with the at current sensor;
   wherein the controller is configured to detect an over-temperature condition in the output stage in dependence on the output of the accumulator associated with the temperature sensor; and
   wherein the programmable response is selected from a group of responses that includes compressing at least a portion of the audio signals without causing a turning off of a transistor of the output stage.

3. The system of claim 1, wherein the controller comprises a pulse width modulation (PWM) controller and the output stage comprises a PWM output stage.

4. The system of claim 3, wherein the one or more sensors comprise at least one current sensor, wherein the controller is configured to detect shoot-through current and to responsively adjust delays between a high-side signal and a low-side signal to minimize the shoot-through current.

5. The system of claim 1, wherein the one or more sensors comprise at least one current sensor.

6. The system of claim 1, wherein the one or more sensors comprise at least one temperature sensor.

7. The system of claim 1, wherein the comparator thresholds and accumulator thresholds are programmable.

8. The system of claim 1, wherein the plurality of sensors comprise at least one current sensor and at least one temperature sensor, and wherein the controller is configured to detect over-current and over-temperature conditions in the output stage.

9. The system of claim 1, wherein at least one of the plurality of programmable responses comprises compressing at least a portion of the audio signals.

10. A method for use with a system including an audio amplifier output stage, the method comprising:
    driving the audio amplifier output stage in dependence on received audio signals;
    using a sensor to sense a condition of the audio amplifier output stage, wherein the amplifier output stage includes at least two transistors;
    comparing an output of the sensor to a first threshold to produce a binary protection signal indicative of whether the first threshold is exceeded;
    incrementing a count when the binary protection signal is a first state; decrementing the count when the binary protection signal is a second state;
    producing a signal indicative of a potential failure condition when the count exceeds a second threshold;

performing one of a plurality of different programmable responses in dependence on the signal indicative of the potential failure condition, wherein the performed response causes the system to operate in a modified manner without causing a turning off of any of the transistors of the amplifier output stage; and continuing to operate the system in a modified manner for at least a period of time during which the potential failure condition persists until the count is sufficiently decremented such that the count no longer exceeds the second threshold.

11. The method of claim 10, wherein the audio amplifier output stage comprises a pulse width modulated (PWM) output stage and wherein sensing the condition of the output stage comprises detecting a current through a transistor of the output stage.

12. The method of claim 11, further comprising detecting a shoot-through condition in the output stage.

13. The method of claim 12, further comprising adjusting relative delays between a high-side signal and a low-side signal input to the output stage to minimize shoot-through.

14. The method of claim 10, wherein the audio amplifier output stage comprises a pulse width modulated (PWM) output stage and wherein sensing the condition of the output stage comprises detecting a temperature of a transistor of the output stage.

15. The method of claim 10, wherein the audio amplifier output stage comprises a pulse width modulated (PWM) output stage and wherein sensing the condition of the output stage comprises detecting a temperature of a heat sink of the output stage.

16. The method of claim 10, further comprising modifying the second threshold.

17. The method of claim 10, wherein the performed programmable response comprises compressing at least a portion of the audio signals.

18. The system of claim 1, wherein:
the controller comprises a pulse width modulation (PWM) controller and the output stage comprises a PWM output stage.

19. The system of claim 2, wherein the at least one temperature sensor is selected from a group consisting of:
a thermal diode;
a temperature sensitive resistor; and
a temperature sensing integrated circuit.

20. The system of claim 2, where during the compressing at least a portion of the audio signals:
a portion of the audio signals that is below a compression threshold is amplified by a first level; and
a portion of the audio signals that is above the compression threshold is amplified by a second level that is below the first level but is greater than multiplying by zero.

21. The system of claim 9, where during the compressing at least a portion of the audio signals:
a portion of the audio signals that is below a compression threshold is amplified by a first level; and
a portion of the audio signals that is above the compression threshold is amplified by a second level that is below the first level but is greater than multiplying by zero.

* * * * *